(12) United States Patent
Ahn et al.

(10) Patent No.: US 9,406,652 B2
(45) Date of Patent: Aug. 2, 2016

(54) STACK MEMORY

(71) Applicant: SILICONFILE TECHNOLOGIES INC., Gyeonggi-do (KR)

(72) Inventors: Sang Wook Ahn, Gyeonggi-do (KR); Huy Chan Jung, Gyeonggi-do (KR); Yong Woon Lee, Gyeonggi-do (KR); Do Young Lee, Gyeonggi-do (KR); Heui-Gyun Ahn, Gyeonggi-do (KR)

(73) Assignee: SILICONFILE TECHNOLOGIES INC., Gyeonggi-do (KR)

( * ) Notice: Subject to any disclaimer, the term of this patent is extended or adjusted under 35 U.S.C. 154(b) by 0 days.

(21) Appl. No.: 14/891,635

(22) PCT Filed: May 12, 2014

(86) PCT No.: PCT/KR2014/004207
§ 371 (c)(1),
(2) Date: Nov. 16, 2015

(87) PCT Pub. No.: WO2014/185669
PCT Pub. Date: Nov. 20, 2014

(65) Prior Publication Data
US 2016/0133603 A1 May 12, 2016

(30) Foreign Application Priority Data
May 15, 2013 (KR) .................. 10-2013-0055176

(51) Int. Cl.
*G11C 5/06* (2006.01)
*H01L 25/065* (2006.01)
*H01L 23/528* (2006.01)
*G11C 7/06* (2006.01)
*G11C 7/10* (2006.01)

(52) U.S. Cl.
CPC ............ *H01L 25/0657* (2013.01); *G11C 5/063* (2013.01); *G11C 7/06* (2013.01); *G11C 7/10* (2013.01); *H01L 23/528* (2013.01); *H01L 2225/0651* (2013.01); *H01L 2225/06541* (2013.01); *H01L 2225/06548* (2013.01); *H01L 2225/06572* (2013.01)

(58) Field of Classification Search
CPC ............ G11C 13/003; G11C 11/1675; G11C 11/4099; G11C 29/1201
See application file for complete search history.

(56) References Cited

U.S. PATENT DOCUMENTS

| 7,827,345 B2* | 11/2010 | Hinrichs | ............ G06F 13/4234 365/63 |
| 8,576,607 B1* | 11/2013 | Nemati | .................. G11C 11/39 365/105 |
| 2007/0067554 A1* | 3/2007 | Hinrichs | ............. G06F 13/4234 710/316 |
| 2013/0141972 A1* | 6/2013 | Yoon | ..................... G11C 11/56 365/185.03 |

FOREIGN PATENT DOCUMENTS

| KR | 100215267 | 8/1999 |
| KR | 100567911 | 4/2006 |
| KR | 1020110126891 | 11/2011 |

* cited by examiner

*Primary Examiner* — Tuan T Nguyen
(74) *Attorney, Agent, or Firm* — IP & T Group LLP

(57) ABSTRACT

A semiconductor memory is formed by stacking a plurality of substrates and memory cells on each substrate are connected by data dump lines. A switch may intervene between the memory cell and the data dump line. When data of each substrate is dumped by the data dump line, a problem of decrease in a speed and an increase in power consumption due to a parasitic component can be minimized. Further, a core circuit including the memory cell may be disposed on one substrate and a peripheral circuit unit may be disposed on the remaining substrates.

10 Claims, 16 Drawing Sheets

STACK MEMORY

This application is a national stage application of PCT/KR2014/004207 filed on May 12, 2014, which claims priority of Korean patent application number 10-2013-0055176 filed on May 15, 2013. The disclosure of each of the foregoing applications is incorporated herein by reference in its entirety.

TECHNICAL FIELD

The present invention relates to a stack memory formed by stacking a plurality of substrates, which are coupled to each other and, more specifically, to a structure where memory cells of each substrate share data dump lines and each of the data dump lines is electrically coupled to each other.

BACKGROUND ART

As a technique of a semiconductor device has been rapidly developed for decades, the integration of a semiconductor memory element has been increased. In case of a DRAM (Dynamic Random Access Memory), the number of semiconductor memory elements integrated in one silicon substrate reached billions. The number of increased semiconductor memory elements requests the increase of a power consumption, and the reduction of an operation speed caused by a parasitic effect. However, due to characteristics of a semiconductor substrate material or a semiconductor package material, it is difficult to accept the increase of the power consumption. Thus, a circuit designer has lowered a power voltage supplied from an external device to an integrated circuit, or has made an internal power voltage lower than an external power voltage. A lower internal power voltage allows a low voltage swing of a circuit and reduces a dynamic current consumption. This is efficient in a circuit for driving a long data line. A dynamic current consumption of a distribution line ($I_L$) is in proportion to the multiple of a capacitive load ($C_L$) of the power distribution line and a variation ratio (dV/dt) of a voltage applied to the power distribution line as expressed in an equation 1.

$$I_L = C_L(dV/dt), \quad \text{Equation 1}$$

Although the integration of a semiconductor memory device is increased, a parasitic element, e.g., a parasitic resistance or a parasitic capacitive load, which is caused by the increase of the distribution lines made of a metal or a polysilicon, may be not reduced. Especially, this problem may be intensified as the integration of a semiconductor memory device increase. For example, if the integration of a semiconductor memory device increases from 1 Giga byte DRAM to 4 Giga byte DRAM, a parasitic element increases theoretically as four times since a length of a power distribution line increases as four times. In fact, due to the development of a minimization technique trend of a semiconductor manufacturing process, the parasitic element does not increase as many times as theoretically. If a linewidth is minimized, since a parasitic capacitance per a unit length is reduced but a parasitic resistance per a unit length increases, a total response time depending on a time constant as a multiple of a resistance R and a capacitance C increases according as the integration of a semiconductor memory device increases.

A reduction of an operation speed and an increase of a power consumption are intensified in a semiconductor memory device, and are exposed in a technique where a plurality of substrates are stacked in a three-dimensional. This problem will be described in details.

A semiconductor memory device includes memory cells for storing information, which are arrayed in a row line and a column line.

As the integration of a semiconductor memory device increases, a parasitic resistance and a parasitic capacitance on a path of binary information increases.

FIG. 1a illustrates a conventional packaged stack structure where a plurality of substrates are coupled to each other by a wire bonding. The problem will be described in this case. FIG. 1a shows a cross section view of a multiple package 100 having a plurality of semiconductor substrates, which are stacked, and each of the plurality of semiconductor substrates 101, 103 and 105 is coupled to each other by a wire bonding. If each of the plurality of semiconductor substrates is a semiconductor memory device, each of the plurality of semiconductor substrates may include a block as shown in FIG. 2.

FIG. 2 illustrates a block including four banks 111 to 114. Each of four banks 111 to 114 includes 32 matrixes MAT_0 to MAT_31. One of 32 matrixes MAT_0 to MAT_31 includes memory cells for storing binary information which are arrayed in a row direction and a column direction. FIG. 2 illustrates an example of a semiconductor memory device having arrayed matrixes. One of the plurality of matrixes will be shown in details in FIG. 3.

The matrix includes memory cells MC of which each is arrayed in a row direction and a column direction. A bit line is commonly coupled to a memory cell in a column direction, and binary information is read or written. The binary information written in a memory cell is transferred by a path of sequence of an input/output (I/O) circuit, a local data line, a bit line and a memory cell through a package or a pin coupled to an external device of a semiconductor substrate. A read path sequence is opposite to a write path sequence.

A parasitic element which exists in a read path or a write path is equivalently shown in FIG. 4.

If it is assumed that a length of a bit line is 400 μm (micrometer) and FIG. 3 illustrates a semiconductor memory device 101 of a first substrate, and a capacitance per unit μm is 1 nF (nano-Farad), a total capacitance $C_{BIT}$ of a bit line is 0.4 pF (pico-Farad). In general, since a length of a local data line is long as a length of a bit line by ten times, the total capacitance $C_{LOC}$ of the local data line is 4 pF. If a length of a global data line is long as a length of a bit line by five times, the total capacitance $C_{GLO}$ of the global data line is 20 pF. If binary information is transferred sequentially via the bit line, the local data line and the global data line, 0.4 pF, 4 pF and 20 pF are sequentially charged or discharged, and this represents the increase of a propagation delay time of data. The propagation delay time is in proportion to a time constant of the path. For the convenience of calculation, if it is assumed that a total parasitic resistance element of the path is 10 ohm, the time constant of the path is 244 ps (pico-second)

Meanwhile, in view of a power consumption, when one cycle is 4 ns (nano-second), if a voltage variation of the data line is 1.2 V (voltage), a dynamic current consumption is 1.2 mA (mill-Ampere) by the equation 1. Herein, if the data has 32 bits, the total number of data lines having a pair is 64. In conclusion, during the one cycle, a total dynamic current which is consumed in a pair of data lines having 32 bits is 76.8 mA, which is greater than 1.2 mA by 64 times. Since a parasitic capacitance CPKG caused by a lead frame of a package or a wire bonding is several pico-Farads pF or dozen pico-Farads pF, the above-described problems will be deteriorated.

As shown in FIG. 1b, these problems do not disappear although a plurality of substrates of the semiconductor memory device are penetrated through a TSV (through silicon via). But, these problems may be reduced as much as the increased amount of the power consumption or the propagation delay time due to the parasitic element $C_{PKG}$ caused by a lead frame of a package or a wire bonding.

Thus, in a semiconductor memory device or a semiconductor device provided by stacking a plurality of substrates, the increase of an operation and the reduction of a power consumption are requested through the reduction of the propagation delay time.

DISCLOSURE

Technical Problem

Various embodiments of the present invention are directed to a stack memory having a structure where a data dump line formed on a substrate is electrically coupled to a data dump line formed on another substrate in case that a plurality of substrates including at least one semiconductor memory device are stacked.

Technical Solution

In accordance with an embodiment of the present invention, a stack memory includes memory cells of a first type arrayed in a first substrate along a row direction and a column direction of a matrix shape; a first dump line for transferring data inputted or outputted to the memory cells of the first type, and commonly coupled to at least one of the memory cells of the first type; memory cells of a second type arrayed in a second substrate along a row direction and a column direction of a matrix shape; and a second dump line for transferring data inputted or outputted to the memory cells of the second type, and commonly coupled to at least one of the memory cells of the second type, wherein the first data dump line is electrically coupled to the second data dump line.

The stack memory further includes a switch formed between the first substrate and the memory cells of the first type, or between the second substrate and the memory cells of the second type. An electrical coupling between the first data dump line and the second data dump line may be formed by directly contacting a conductive material of the first data dump line with a conductive material of the second data dump line. An electrical coupling between the first data dump line and the second data dump line may be formed by a conductive pad having an area larger than an area of a conductive material of the first dump line or the second dump line. The first substrate and the second substrate may be stacked to have a multi-layer structure. A switching element may be added between the first data dump line or the second data dump line and at least one of the memory cells of the first type or the memory cells of the second type. A size of the memory cells of the first type may be different from a size of the memory cells of the second type.

In accordance with embodiments of the present invention, one of the memory cells of the first type and the memory cells of the second type may be volatile or non-volatile.

In accordance with embodiments of the present invention, a dump switch for a selective coupling may be added between the data dump line and the pad.

In accordance with another embodiment of the present invention, a stack memory includes a first substrate including memory cells, which are arrayed in a column direction and a row direction, a sense amplifier for sensing data outputted from the memory cell, and a write driver for driving data inputted to the memory cells; and a second substrate including an input/output circuit for transferring data inputted to the memory cells, wherein the first substrate is electrically coupled to the second substrate by a first data dump line formed in the first substrate and a second data dump line formed in the second substrate.

In accordance with another embodiment of the present invention, a switching element may be added between the first data dump line and at least one of the memory cells.

A stack memory in accordance with another embodiment of the present invention includes a data dump line, which is separately disposed from a bit line or a word line when the data is transferred between the memory cells of the first substrate and the memory cells of the second substrate by the data dump line.

Advantageous Effects

In case that a plurality of semiconductor substrates are stacked in accordance with embodiments of the present invention, a data transferring speed between substrates increases and a power consumption is reduced. A stack memory in accordance with embodiments of the present invention may be used as a cache memory since data dump lines correspond one to one between substrates, or data dump lines are efficiently performed by a switch for selecting data dump lines although data dump lines correspond to each other between substrates.

BEST MODE

Figure 1A:
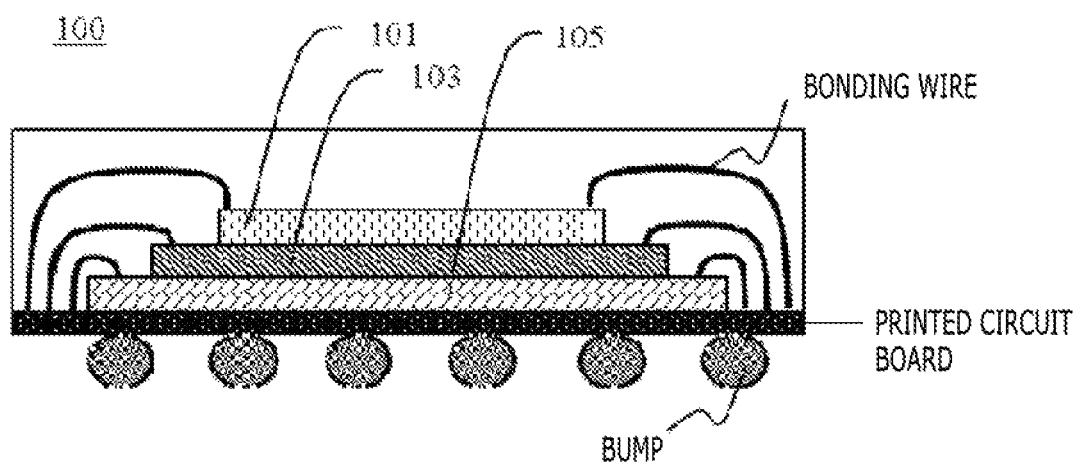
FIG. 1a illustrates a conventional packaged stack structure where a plurality of substrates are coupled to each other by a wire bonding.
Figure 1B:
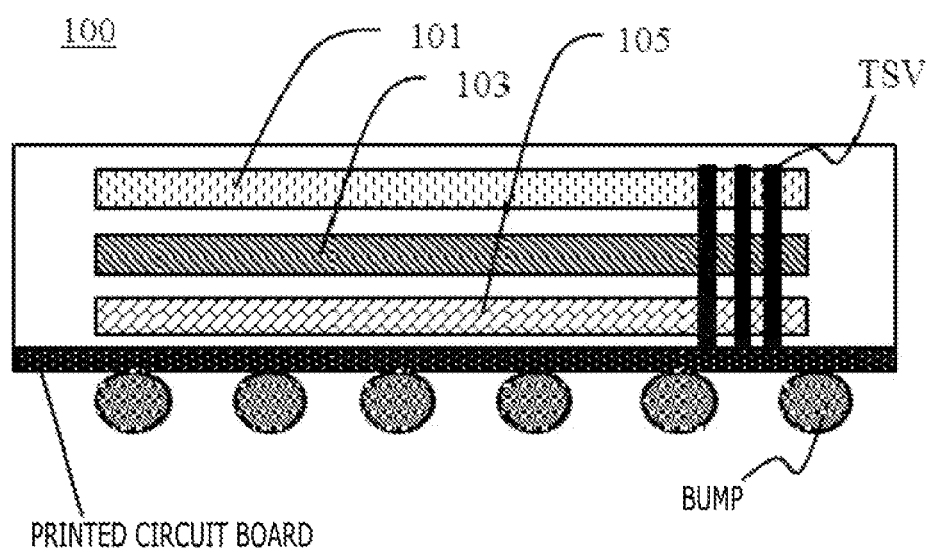
FIG. 1b illustrates a conventional packaged stack structure where a plurality of substrates are coupled to each other through a TSV.
Figure 2:
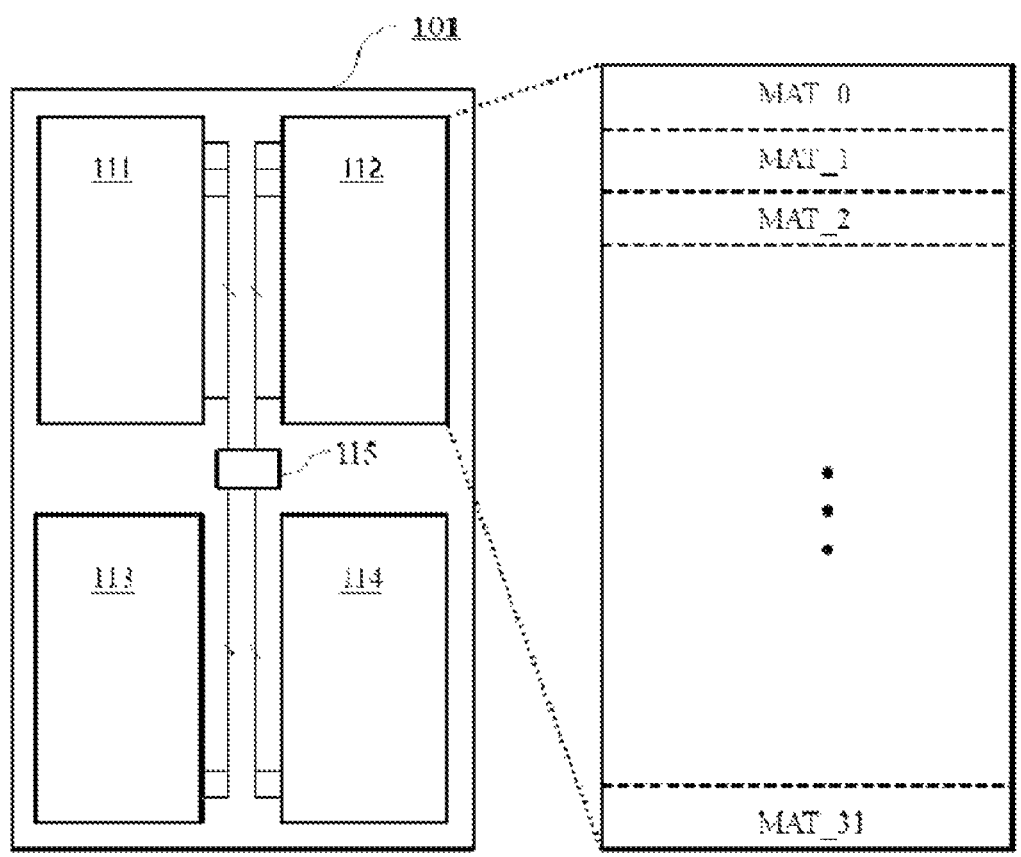
FIG. 2 illustrates an example of a semiconductor memory device having arrayed matrixes.
Figure 3:
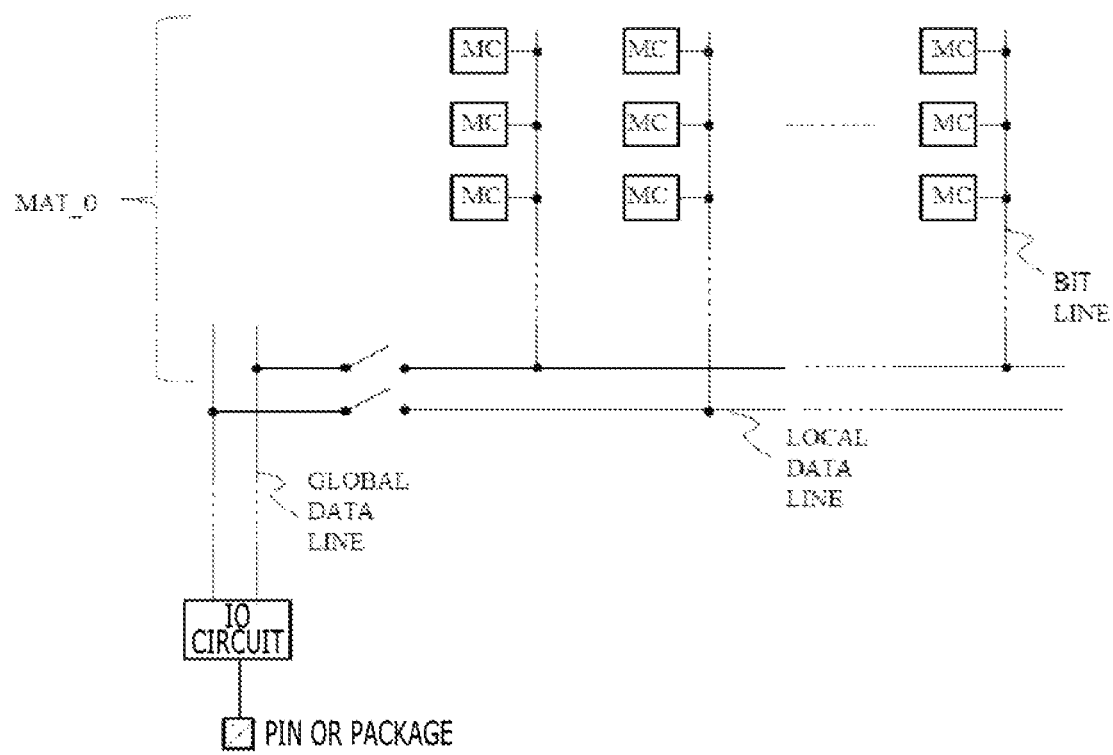
FIG. 3 illustrates memory cells and data paths.
Figure 4:
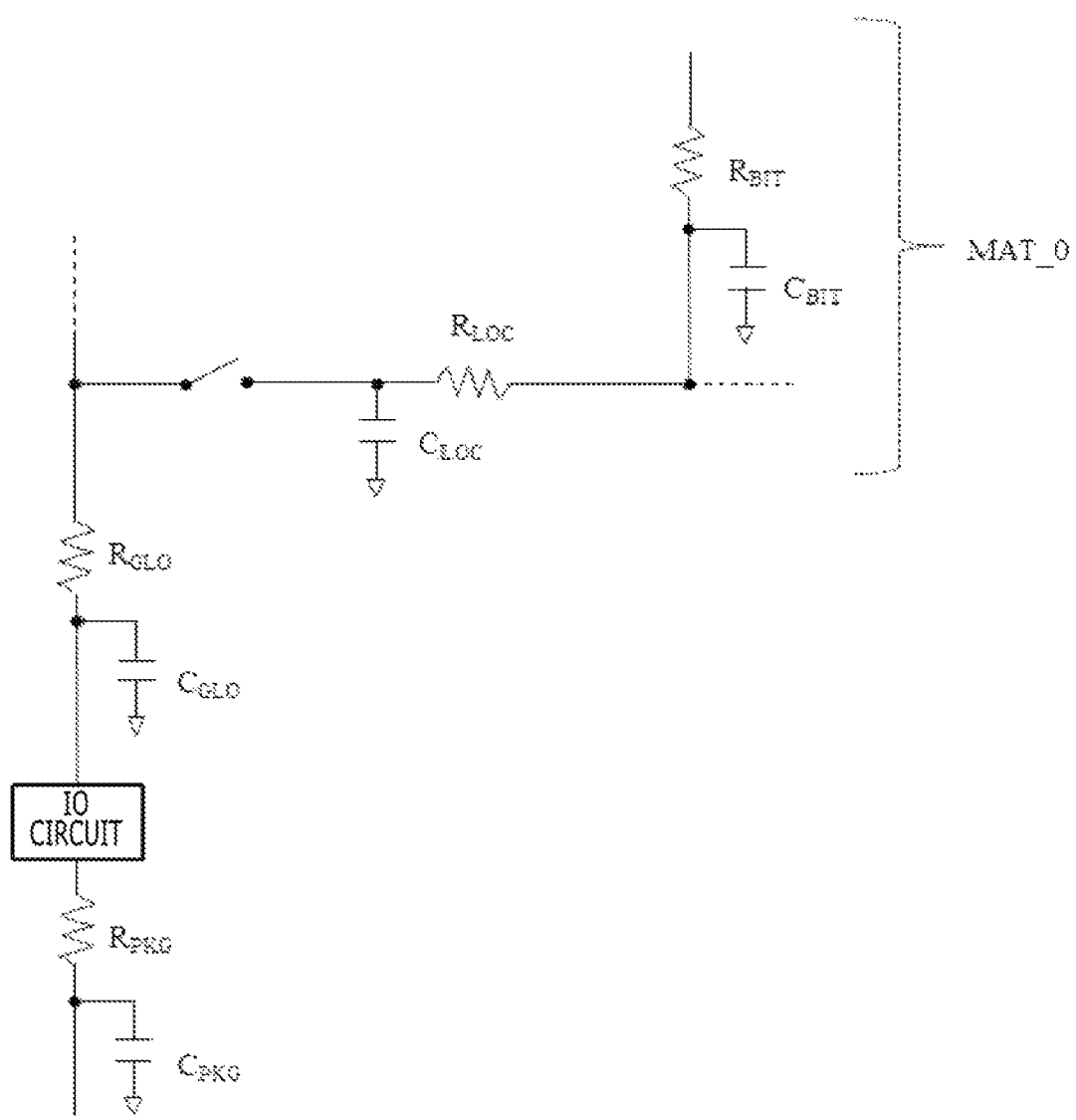
FIG. 4 illustrates a capacitance element which exists on a data path.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned.

Figure 5A:
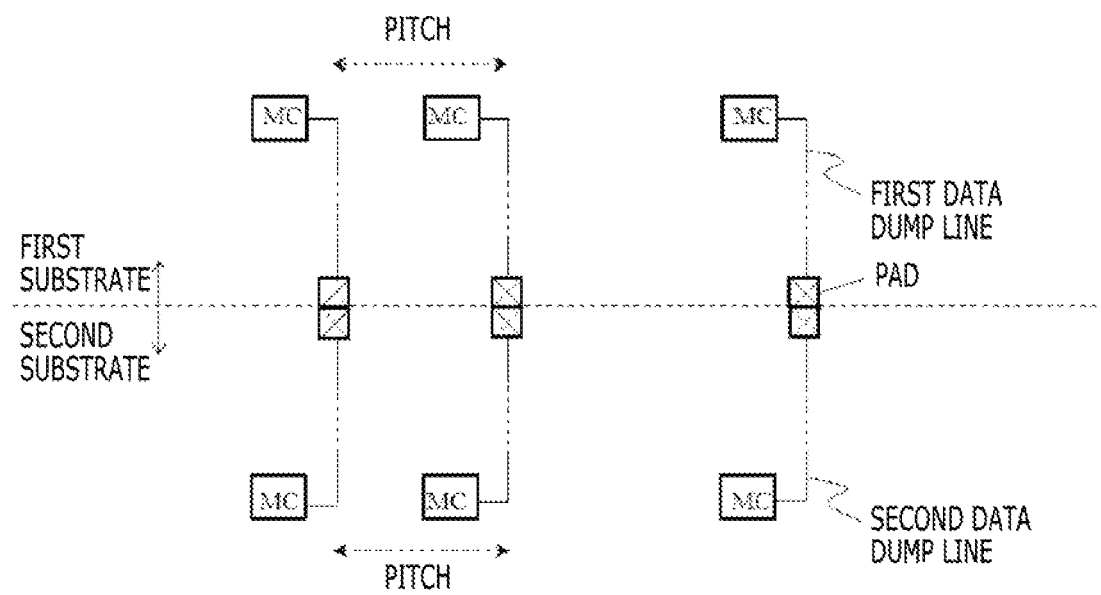
FIG. 5a illustrates a stack memory in accordance with an embodiment of the present invention.

FIG. 5a illustrates a stack memory in accordance with an embodiment of the present invention.

Referring to FIG. 5a, first data dump lines used in writing or reading binary information are disposed in a memory cell MC formed in a first semiconductor substrate. For the convenience of the descriptions, word lines coupled to a cell array are not shown. The memory cell MC may be a nonvolatile memory element including a flash memory, or a volatile memory element including a static random access memory (SRAM) or a dynamic random access memory (DRAM).

Memory cells of a first substrate are electrically coupled to memory cells of a second substrate, respectively. These electrical couplings may be performed using a direct bond interconnect (DBI) technique or other techniques. In this embodiment of the present invention, memory cells MC are shown as a block, but the memory cells MC may be constituted of several transistors, or a flash memory where several transistors are coupled to each other in serial. Since a coupling structure through the data dump lines is not changed, the above-described constitution may be applied to all embodiments of the present invention.

Since the data dump lines of the first substrate and the data dump lines of the second substrate are made of conductive materials of which a line width is narrow, pad regions where a line width of the conductive materials on a coupling portion is wider than a line width of the conductive materials of a memory cell array are formed to be contacted with each other to smoothly couple the data dump lines of the first substrate to the data dump lines of the second substrate.

A pitch interval between memory cells of the first substrate is same as a pitch interval between memory cells of the second substrate. A pitch interval between data dump lines of the first substrate is same as a pitch interval between data dump lines of the second substrate.

When data is transferred from a memory cell MC of the first substrate to a memory cell of the second substrate, only a parasitic resistance and a parasitic capacitance of the data dump lines are parasitic elements to be overcome. Since the data is transferred to a memory cell of a different substrate through a data dump line, a semiconductor memory having a plurality of stacked substrates includes a minimized parasitic element of a transferring path of the data, and is applied to a cache system, which operates rapidly in response to an instruction of a central processor unit (CPU).

Figure 5B:
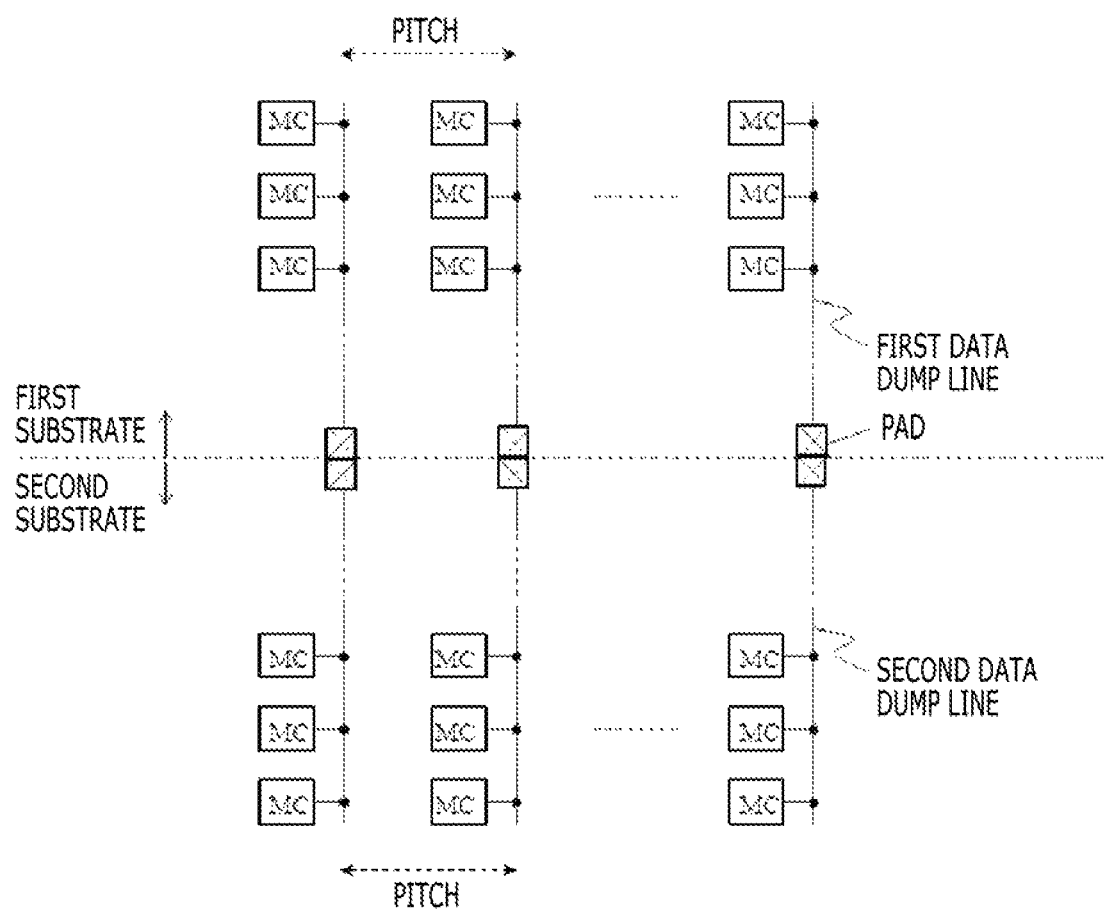
FIG. 5b illustrates a stack memory in accordance with another embodiment of the present invention.

The stack memory shown in FIG. 5a may be extended to a stack memory shown in FIG. 5b. The first substrate and the second substrate of the stack memory are coupled to each other by a memory cell unit, but, a first substrate and a second substrate of the stack memory shown in FIG. 5b are coupled to each other by a column unit. Although not described in details, it is not necessary to dispose a pad for coupling data dump lines to each other on a center of a memory cell array, and the pad may be disposed on a peripheral region of a sense amplifier or a circuit for selecting columns. Although described in details in a later, it is preferred that a contact region of the data dump lines is disposed on a core circuit portion to exclude a memory cell array.

Figure 5C:
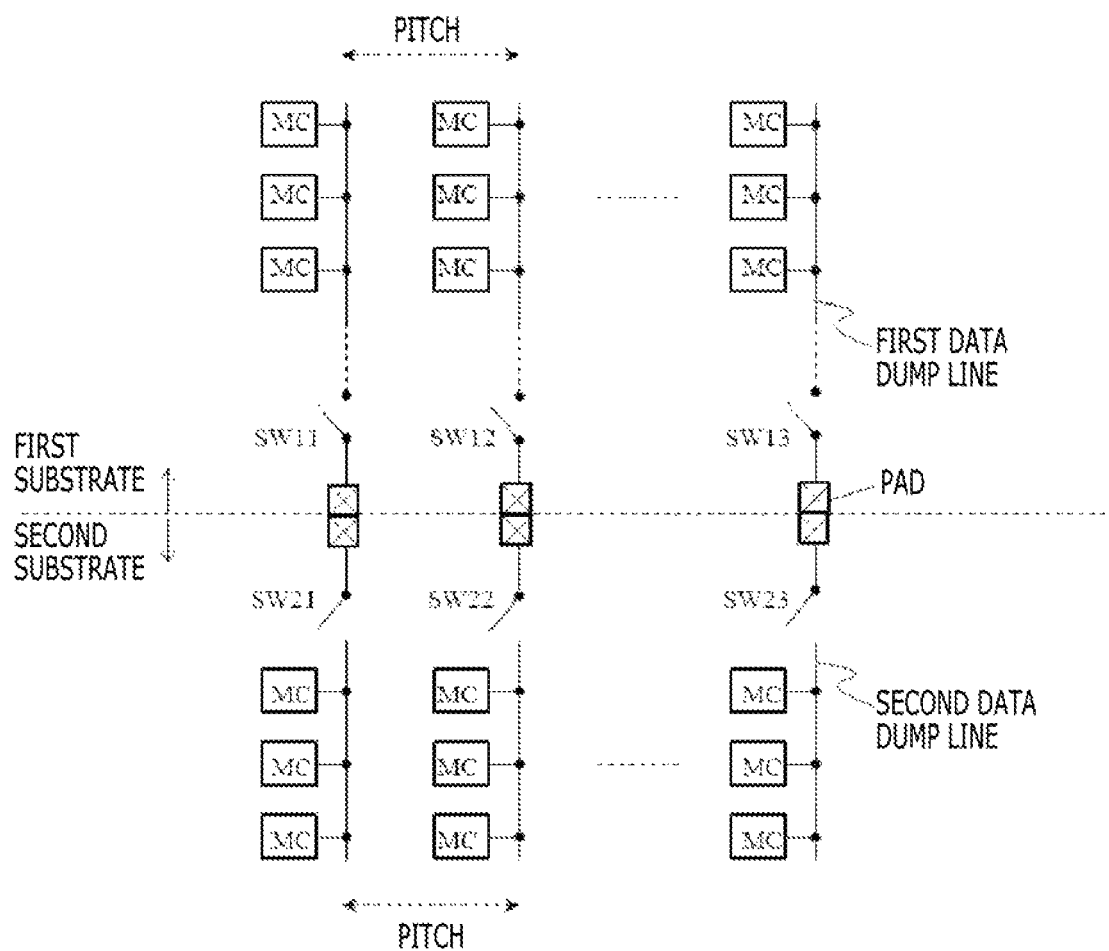
FIG. 5c illustrates a stack memory in accordance with another embodiment of the present invention.

The stack memory in embodiments of the present invention shown in FIGS. 5a and 5b may be implemented by adding a switch between the pad and the data dump line as shown in FIG. 5c. When data is transferred between the first substrate and the second substrate, column switches SW11 to SW13 and SW21 to SW23 of each of the first and second substrates may be properly selected by an address signal or a selection signal, and may exist on any one of the first substrate and the second substrate. The data dump lines of each of the first substrate and the second substrate may be separately selected by the column switches.

Although not shown in FIGS. 5a to 5c, a switch may be further formed between each of the data dump lines and the pad.

Hereinafter, for the convenience of the descriptions, a structure where a first substrate is coupled to a second substrate by a memory cell unit is referred to as 'A-type' as shown in FIG. 5a, a structure where a first substrate is coupled to a second substrate by a column unit is referred to as 'B-type' as shown in FIG. 5b, and a structure where a switch is added is referred to as 'C-type' as shown in FIG. 5c.

Figure 6:
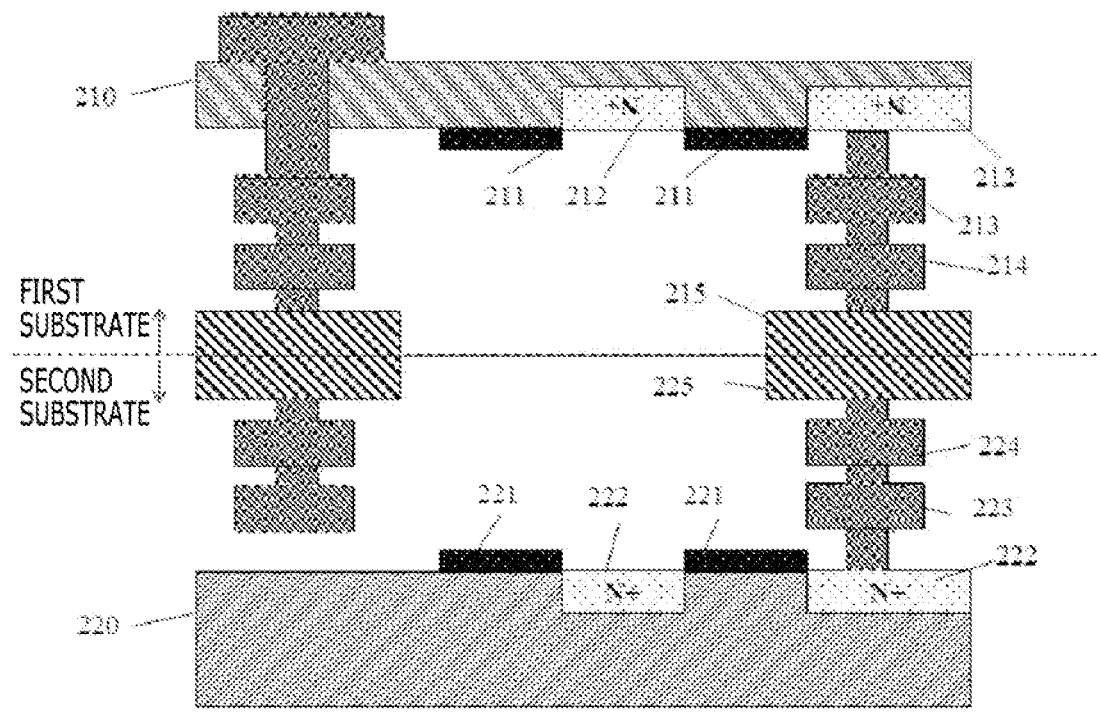
FIG. 6 is a cross section view of a stack memory in accordance with an embodiment of the present invention.

FIG. 6 is a cross section view of a stack memory in accordance with an embodiment of the present invention. Impurity diffusion regions 212 and 222 and gate regions 211 and 221 which form a semiconductor active element are disposed in a first substrate 210 and a second substrate 220, respectively. First metal layers 213 and 223 and second metal layers 214 and 224 for electrical couplings are disposed in the first substrate 210 and the second substrate 220, respectively. The impurity regions 212 and 222, the first metal layers 213 and 223 and the second metal layers 214 and 224 may be coupled to each other by a TSV. If the semiconductor active element is a volatile memory device or a nonvolatile memory device, the semiconductor active element may be a transistor representing a memory cell. The first substrate and the second substrate are separately manufactured and contacted with each other. Memory cells of the first substrate and the second substrate are coupled to each other through a pad 215 of the first substrate and a pad 225 of the second substrate as shown in FIG. 6. The couplings of the pads 215 and 225 may be implemented using a DBI technique. The conductive materials used in the coupling are metal materials including a tungsten (W), an aluminum (Al), a copper (Cu), a titanium (Ti), a molybdenum (Mo), and so on. But, the conductive materials are not limited within these metal materials. For example, a material having an electrical conductivity such as a polysilicon having a sufficient electrical conductivity may be used for the conductive materials. In case of the coupling using the DBI, a coupling process may be implemented at a room temperature or a higher temperature than the room temperature. In case of the coupling not using the DBI, any coupling technique between conductive materials used in a semiconductor manufacturing process may be used in the coupling of pads. It is preferred that the linewidth of the pad coupling is wider than the linewidth of the conductive materials of each of the data dump lines.

Figure 7A:
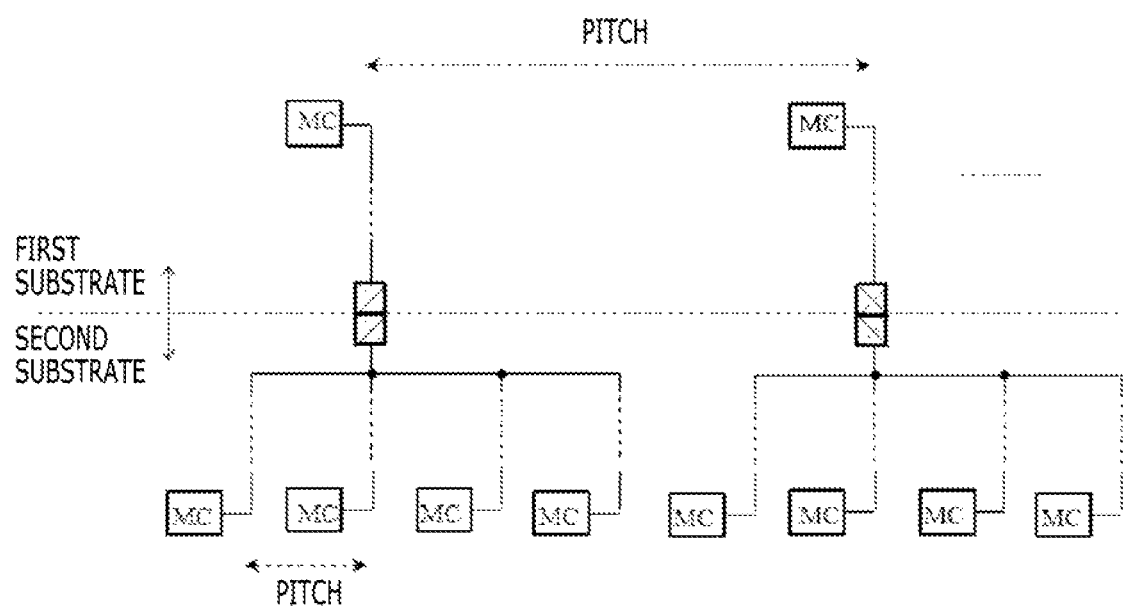
FIG. 7a illustrates a stack memory in accordance with another embodiment of the present invention.
Figure 7B:
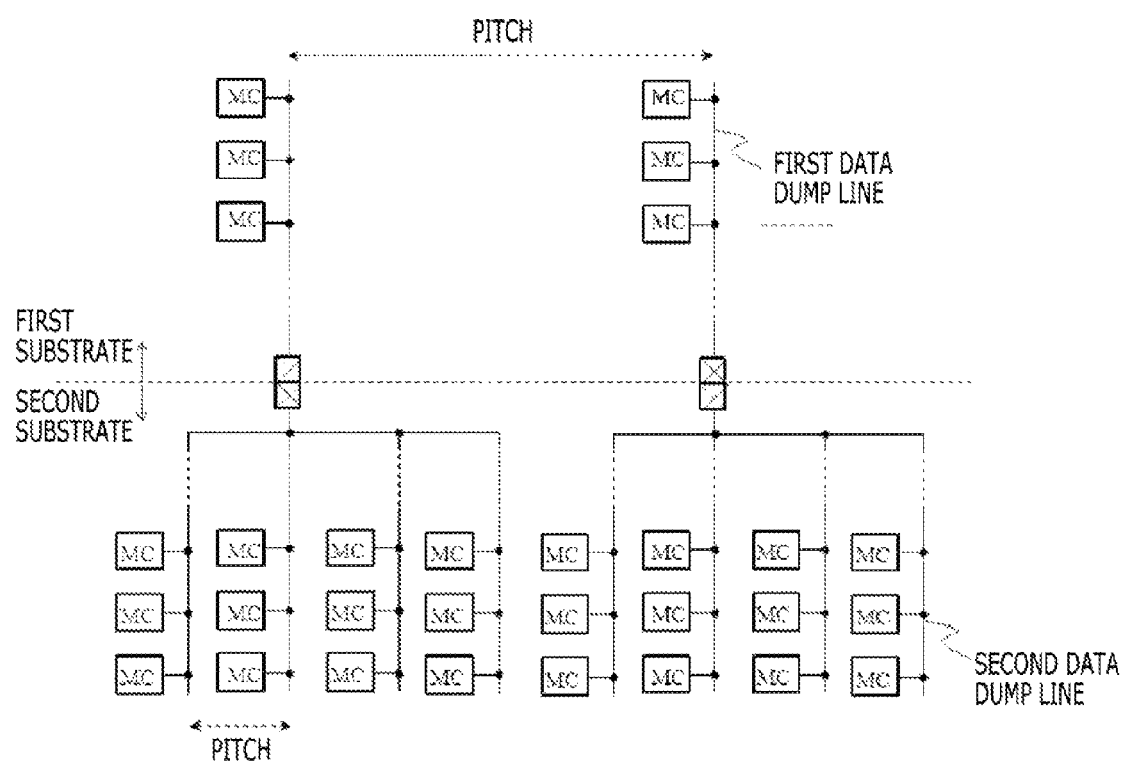
FIG. 7b illustrates a stack memory, which is derived from the stack memory shown in FIG. 7a, in accordance with another embodiment of the present invention.
Figure 7C:
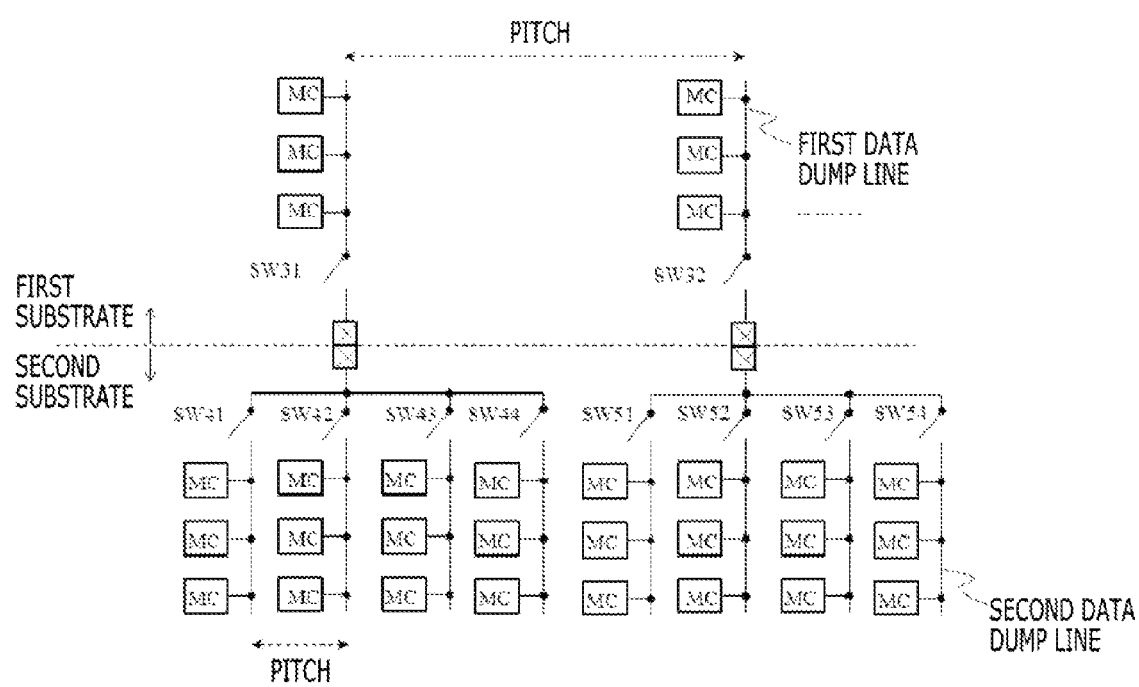
FIG. 7c illustrates a stack memory, which is derived from the stack memory shown in FIG. 7a, in accordance with another embodiment of the present invention.

FIG. 7a illustrates a stack memory in accordance with another embodiment of the present invention. The stack memory shown in FIG. 7a corresponds to the above-described 'A-type'. Referring to FIG. 7a, a plurality of data dump lines of a second substrate may be coupled to a data dump line of a first substrate according to a size or a memory cell or a kind of the memory cell. If four data dump lines of the second substrate are coupled to one data dump line of the first substrate, a pitch interval of the data dump line of the first substrate may be different from a pitch interval of the data dump line of the second substrate. It is preferred that the pitch interval of a memory cell of one substrate is greater than the pitch interval of a memory cell of another substrate by an integer times in order to smoothly couple memory cells having different pitch intervals in a memory cell array. The detailed descriptions will be described with reference to FIG. 8.

The stack memory shown in FIG. 7a may be implemented as 'B-type' by being expanded by a column unit, and may be implemented as 'C-type' by adding switches SW31, SW32, SW41 to SW44 and SW51 to SW54 on the first substrate or the second substrate. Each of the switches may operate at a different timing or a same timing according to a purpose.

Figure 8:
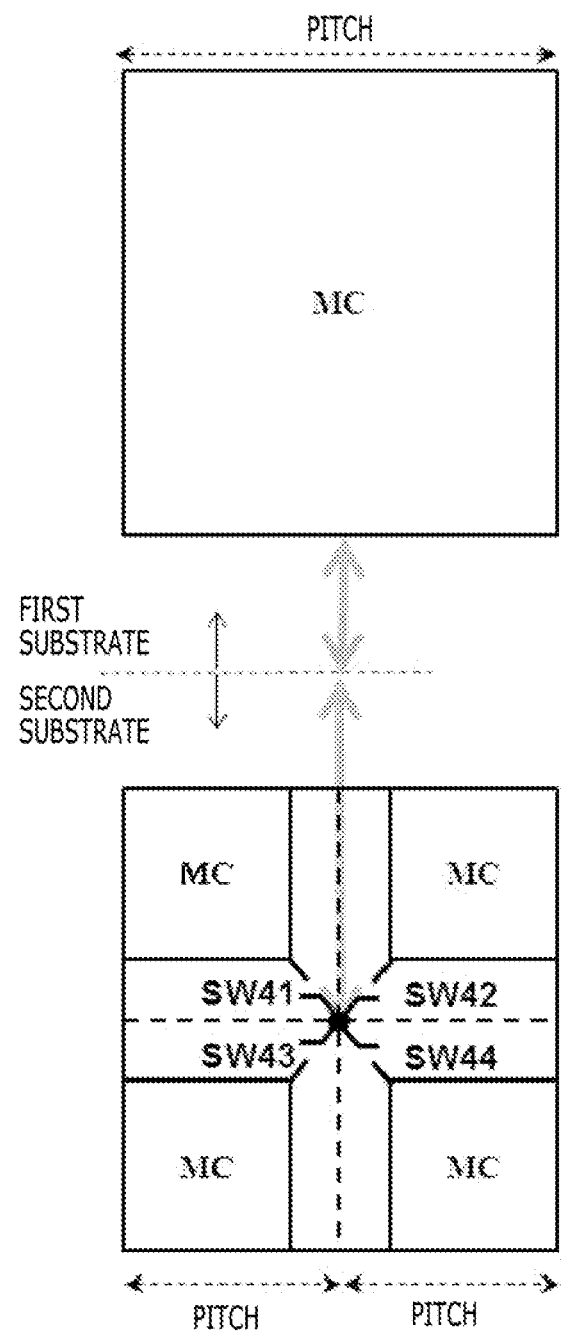
FIG. 8 is a plane view of a stack memory in accordance with another embodiment of the present invention.

FIG. 8 is a plane view of a case that four memory cells MC of a second substrate correspond to one memory cell MC of a first substrate and a switch is added to each of the memory cells of the second substrate. As described above, when a switch is added between a memory cell and a data dump line, the switch may be added in the first substrate and the second substrate, and the switch may be added in one of the first substrate and the second substrate as shown in FIG. 8. If an area of the memory cell of the first substrate is larger than an area of the memory cell of the second substrate by four times, it is preferred that a pitch interval of the first substrate in a column direction is greater than a pitch interval of the second substrate in a column direction.

Figure 9:
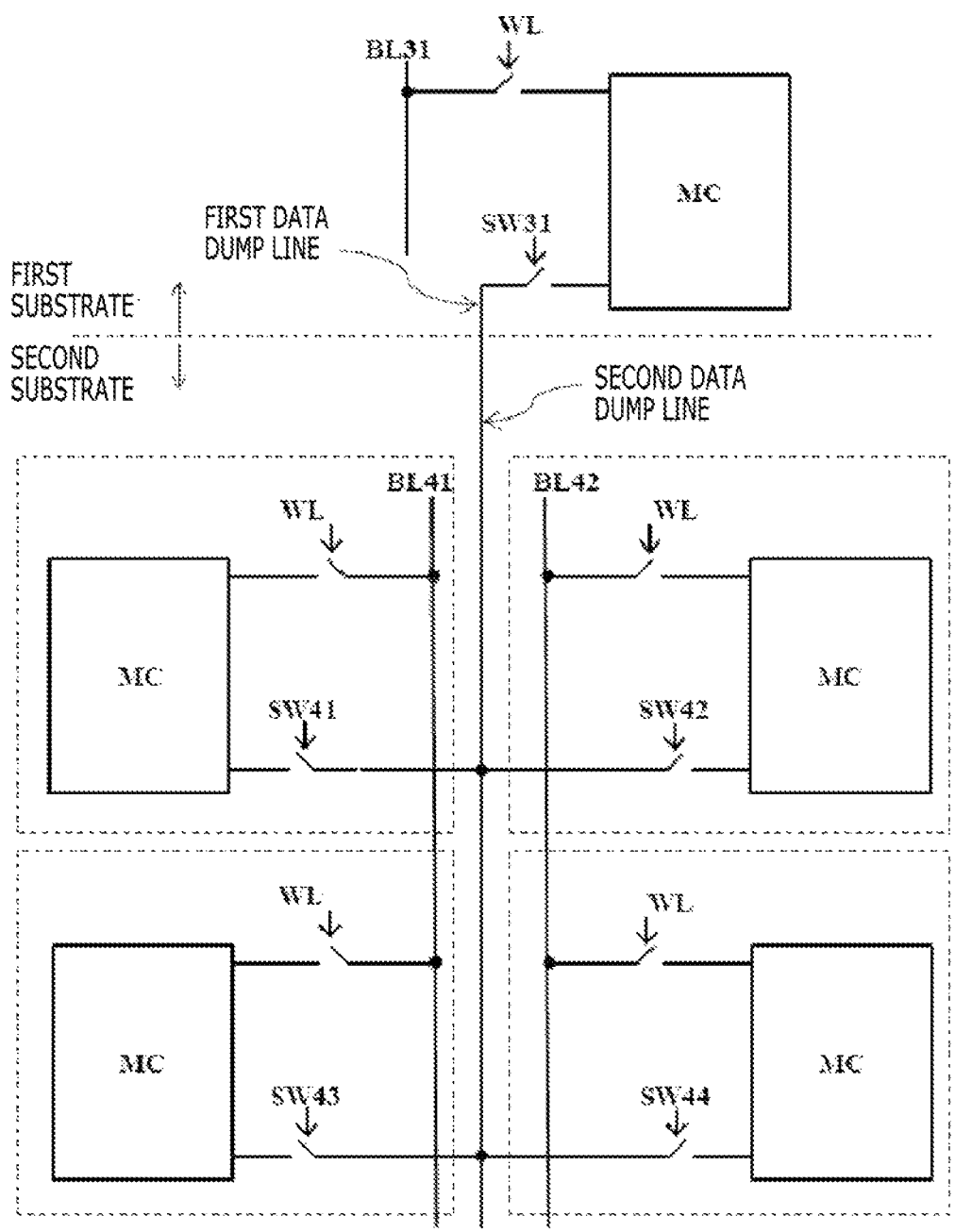
FIG. 9 illustrates a stack memory including bit lines and data dump lines in accordance with another embodiment of the present invention.

An embodiment of the present invention is described with reference to FIG. 9. A stack memory shown in FIG. 9 is improved more than a tack memory shown in the above-mentioned other embodiments of the present invention. A bit line BL and a dump line are disposed separately in each of memory cells. Although not described in the above-mentioned other embodiments of the present invention, the bit line and the data dump line may be disposed in each of the memory cells. The bit line BL and the word line WL are not used for a data dump between the first substrate and the second substrate and used for transferring or receiving data from an external device of the first substrate or an external device of the second substrate. The bit line BL and the word line WL may exist in one of the first substrate and the second substrate.

It is preferred that a switch for a dump is added when the data is dumped from a memory cell of the first substrate to a memory cell of the second substrate or from a memory cell of the second substrate to a memory cell of the first substrate. It may be preferred that the memory cell of the first substrate or the memory cell of the second substrate has a latch type circuit. Switches coupled to bit lines are disposed in each of the memory cells of the second substrate. The switches are driven in response to word line signals WL. The data dump may be performed from the first substrate to the second substrate or from the second substrate to the first substrate.

Switches may be disposed between bit lines and memory cells of the substrate. In case that dump switches dump1 to dump4 for dumping the data and bit line switches are separately disposed in the second substrate, a wring operation or a reading operation is performed outside the second substrate. Since the data dump line and the bit line are separated, the reading operation and the writing operation are performed irrespective of the data dump line.

Figure 10:
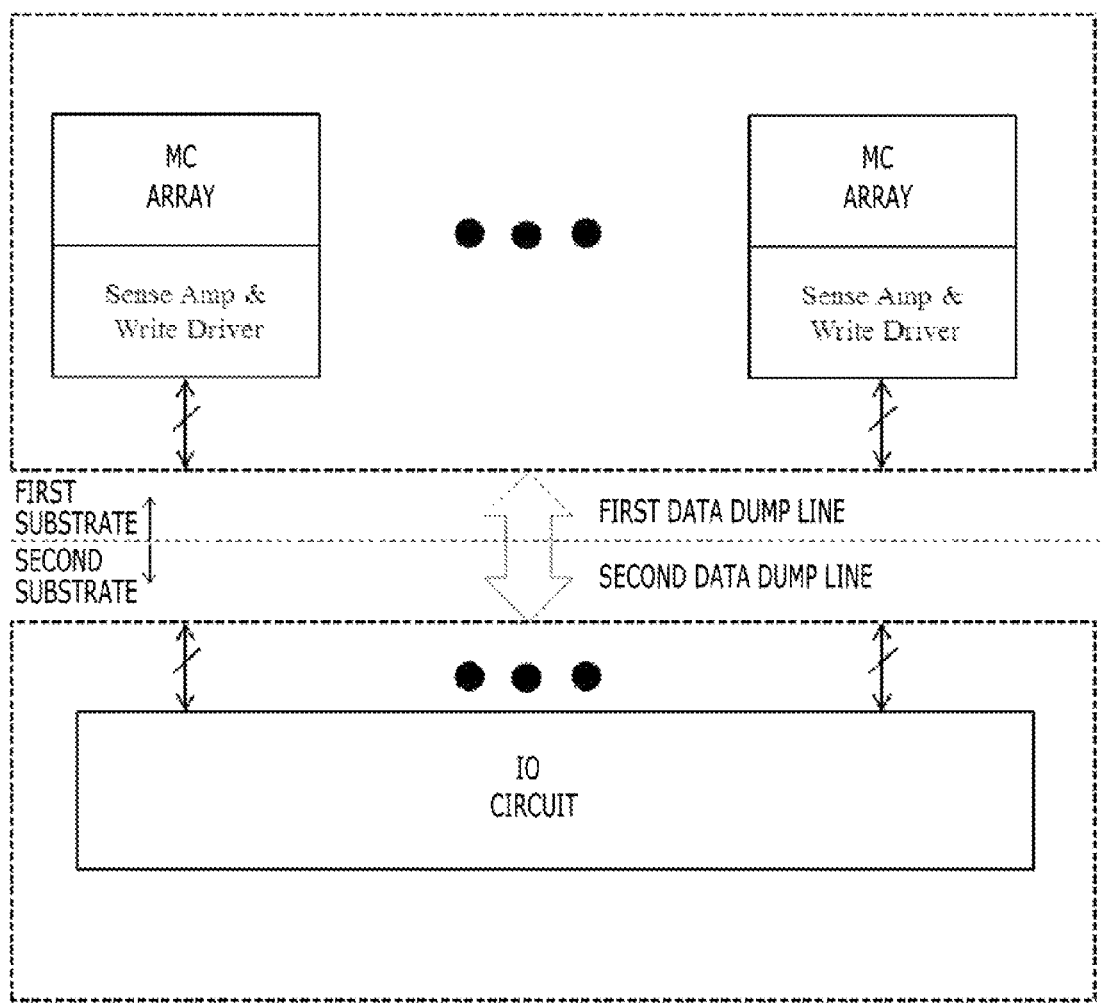
FIG. 10 illustrates a stack memory including a plurality of substrates of which a memory cell portion and a peripheral circuit portion are disposed on each in accordance with another embodiment of the present invention.

FIG. 10 illustrates a stack memory in accordance with another embodiment of the present invention. A memory cell array, a sense amplifier and a write driver are formed in a first substrate, an input/output (IO) circuit for inputting/outputting data is formed in a second substrate. Core circuits such as memory cells, a sense amplifier and a write driver may be disposed in one substrate, and a peripheral circuit such as an input/output circuit may be disposed in a different substrate.

Figure 11:
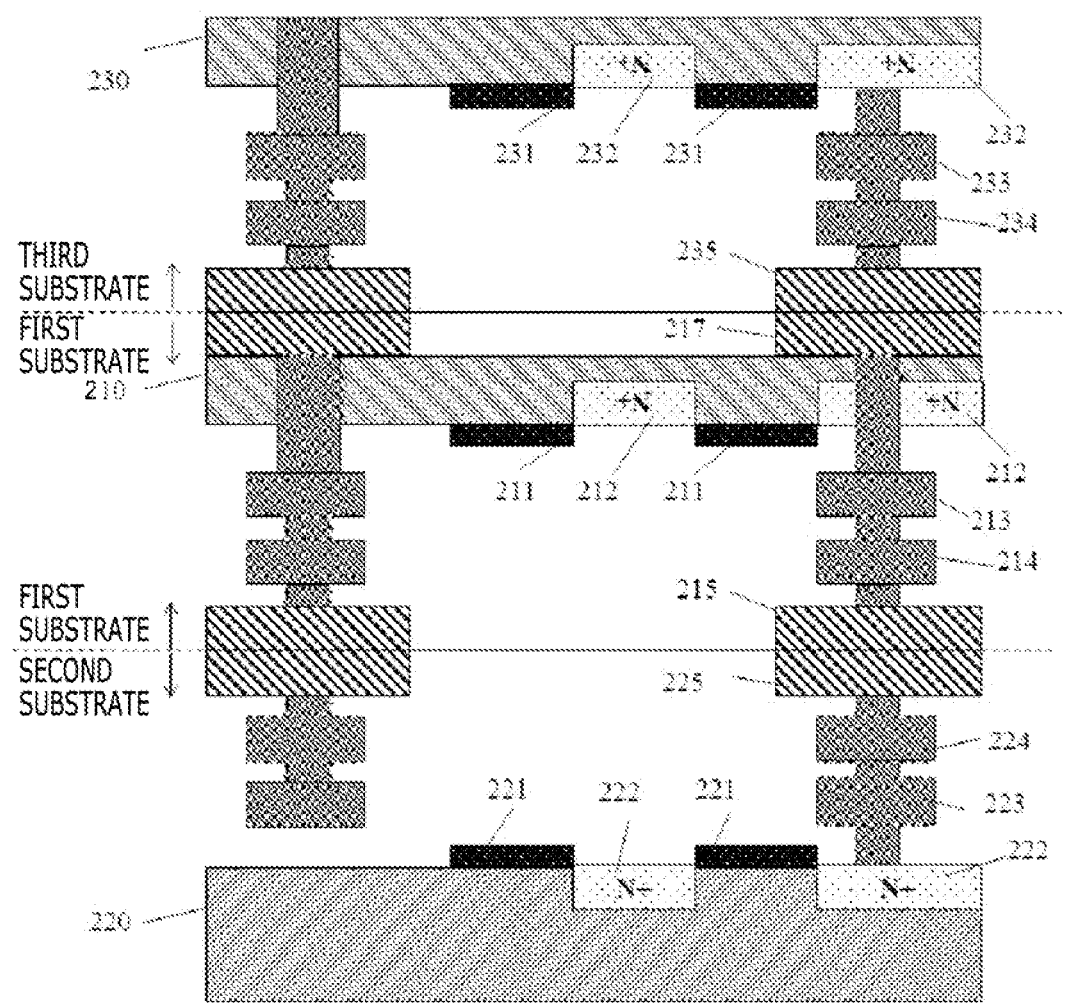
FIG. 11 illustrates a stack memory including at least three substrates in accordance with another embodiment of the present invention.

In all embodiments of the present invention, at least three substrates may be stacked as shown in FIG. 11. A third substrate 230 is stacked on a substrate 210, and a pad 217 of the first substrate 210 is electrically coupled through a pad 235 of the third substrate 230.

A gate 231 and a diffusion region 232 of an active element such as a transistor are separately disposed in the third substrate. As described above, the number of semiconductor substrates are not limited theoretically, and the number of semiconductor elements to be integrated increases as a plurality of substrate are stacked.

In any embodiment of the present invention, when the data is dumped from a memory cell of a first substrate to a memory cell of a second substrate or from a memory cell of a second substrate to a memory cell of a first substrate, a parasitic capacitance of a local data line, which expands along a word line direction of a memory cell array, and a parasitic capacitance of a global data line, which couples each of array matrixes to each other, do not exist. Thus, it does not need to overcome the parasitic capacitance of the local data line and the parasitic capacitance of the global data line. As described in the conventional stack memory, when it is assumed that a total capacitance of one data dump line is 0.4 pF (pico-farad) and an equivalent parasitic capacitance of the data dump line is 10Ω (ohm), although the data dump line of the first substrate is electrically coupled to the data dump line of the second substrate, the time constant is 8 ps (pico-second). Thus, the transferring of data is performed rapidly by dozen times with less power consumption.

Although various embodiments have been described for illustrative purposes, it will be apparent to those skilled in the art that various changes and modifications may be made without departing from the spirit and scope of the invention as defined in the following claims.

What is claimed is:

1. A stack memory, comprising:
   memory cells of a first type arrayed in a first substrate along a row direction and a column direction of a matrix shape;
   a first dump line for transferring data inputted or outputted to the memory cells of the first type, and commonly coupled to at least one of the memory cells of the first type;
   memory cells of a second type arrayed in a second substrate along a row direction and a column direction of a matrix shape; and
   a second dump line for transferring data inputted or outputted to the memory cells of the second type, and commonly coupled to at least one of the memory cells of the second type,
   wherein the first data dump line is electrically coupled to the second data dump line.

2. The stack memory of claim 1, further comprising:
a switch formed between the first substrate and the memory cells of the first type, or between the second substrate and the memory cells of the second type.

3. The stack memory of claim 1, wherein an electrical coupling between the first data dump line and the second data dump line is formed by directly contacting a conductive material of the first data dump line with a conductive material of the second data dump line.

4. The stack memory of claim 1, wherein an electrical coupling between the first data dump line and the second data dump line is formed by a conductive pad having an area larger than an area of a conductive material of the first dump line or the second dump line.

5. The stack memory of claim 1, wherein the first substrate and the second substrate are stacked to have a multi-layer structure.

6. The stack memory of claim 1, wherein a switching element is added between the first data dump line or the second data dump line and at least one of the memory cells of the first type or the memory cells of the second type.

7. The stack memory of claim 1, wherein a size of the memory cells of the first type is different from a size of the memory cells of the second type.

8. The stack memory of claim 1, wherein any one of the memory cells of the first type and the memory cells of the second type is volatile or non-volatile.

9. The stack memory of claim 1, further comprising:
a first bit line disposed in the first substrate and being coupled to one of the memory cells of the first type in a column direction separately from the first data dump line;
a first word line disposed in the first substrate and being coupled to one of the memory cells of the first type in a row direction separately from the first data dump line;
a second bit line disposed in the second substrate and being coupled to one of the memory cells of the second type in a column direction separately from the second data dump line; and
a second word line disposed in the second substrate and being coupled to one of the memory cells of the second type in a row direction separately from the second data dump line.

10. A stack memory, comprising:
a first substrate including memory cells, which are arrayed in a column direction and a row direction, a sense amplifier for sensing data outputted from the memory cell, and a write driver for driving data inputted to the memory cells; and
a second substrate including an input/output circuit for transferring data inputted to the memory cells,
wherein the first substrate is electrically coupled to the second substrate by a first data dump line formed in the first substrate and a second data dump line formed in the second substrate.

* * * * *